(12) United States Patent
Yamunan

(10) Patent No.: US 6,917,098 B1
(45) Date of Patent: Jul. 12, 2005

(54) THREE-LEVEL LEADFRAME FOR NO-LEAD PACKAGES

(75) Inventor: Vinu Yamunan, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 8 days.

(21) Appl. No.: 10/750,102

(22) Filed: Dec. 29, 2003

(51) Int. Cl.[7] .................. H01L 23/495; H01L 23/48
(52) U.S. Cl. ............... 257/666; 257/676; 257/692; 257/696
(58) Field of Search ...................... 257/666, 676, 257/692, 696

(56) References Cited

U.S. PATENT DOCUMENTS

2004/0212053 A1 * 10/2004 Koh et al. ............... 257/676
2004/0217450 A1 * 11/2004 Li et al. .................. 257/666

FOREIGN PATENT DOCUMENTS

EP          582084      *  6/1994

* cited by examiner

Primary Examiner—Allan R. Wilson
Assistant Examiner—Joseph Nguyen
(74) Attorney, Agent, or Firm—W. James Brady, III; Frederick J. Telecky, Jr.

(57) ABSTRACT

A semiconductor device (700) having a leadframe with a first plurality of segments (110) having a narrow end portion (111) in a first horizontal plane (211) and a wide end portion (112) in a second horizontal plane (212). The leadframe further includes a second plurality of segments (120) having a narrow center portion (121) in the first horizontal plane, at least one wide center portion (122) in the second horizontal plane, and narrow end portions (123) in a third horizontal plane (213), which is located between the first and second planes.

19 Claims, 3 Drawing Sheets

THREE-LEVEL LEADFRAME FOR NO-LEAD PACKAGES

FIELD OF THE INVENTION

The present invention is related in general to the field of semiconductor devices and processes, and more specifically to the structure and material of leadframes for integrated circuit devices.

DESCRIPTION OF THE RELATED ART

When the flip-chip technology is used in the assembly of semiconductor devices, in spite of its frequently higher cost compared to wire bonding, it is often required in order to meet demanding performance goals. Among these performance goals are higher numbers of input/output (I/O) terminals, shorter electrical paths for higher speed and frequency, and lower heat dissipation paths for improved thermal performance. These performance goals are driven, for instance, by the pervasive growth of semiconductor products for the wireless and computer peripheral markets. Devices with a need for high frequency performance yet low I/O count include power amplifiers and optical transceivers.

In another trend in the semiconductor industry, driven by miniaturization of chips and packages, there is increased interest in small outline no-lead, or leadless, package types because of their chip-scale dimensions and lower material content and cost. These packages do not have leads, per se, but only land areas that are exposed on the bottom side of the package. Pressure contact or solder joints are made to these land areas. Most often, however, no-lead packages are based on wire bonding technology. Only recently have no-lead packages been proposed in the literature for flip-chip assembly; these packages are, however, only suitable for low I/O count (8 to 100 I/O's).

In order to provide a no-lead package for a flip-chip assembled device of intermediate I/O count, a solution has to be found how to structure a leadframe from an original sheet of metal in order to produce an array of contact pads, which takes advantage of the fact that the bumps are distributed over the whole chip area and not just around the chip periphery.

A need has arisen for a low-cost leadframe structure, preferably pre-plated for reliable solderability. The leadframe and its method of fabrication should be flexible enough to be applied for different semiconductor product families and a wide spectrum of design and assembly variations, and should achieve improvements toward the goals of enhanced process yield and device reliability. Preferably, these innovations should be accomplished using the installed equipment base so that no investment in new manufacturing machines is needed.

SUMMARY OF THE INVENTION

One embodiment of the invention is a leadframe for use in the assembly of semiconductor chips. The leadframe includes a first plurality of segments, each segment of the first plurality having a narrow end portion in a first horizontal plane and a wide end portion in a second horizontal plane. The leadframe further includes a second plurality of segments, each segment of the second plurality having a narrow center portion in the first horizontal plane, at least one wide center portion in the second horizontal plane, and narrow end portions in a third horizontal plane, which is located between the first and second planes. The wide segment portions may be covered by a layer of noble metal, preferably gold, or by a layer of solderable metal, preferably palladium. The narrow end portions of the first segment plurality and the narrow central portions of the second segment plurality may be covered by a layer of noble metal or a layer of solderable metal.

Another embodiment of the invention is a semiconductor device, which uses a leadframe as described above. The device further has an integrated circuit chip, which has on its active surface a first plurality of contact pads located in the peripheral chip portions, and a second plurality of contact pads centrally located; each of these pads has an interconnection element attached. The narrow end portions of the first plurality of leadframe segments are attached to the interconnection elements on the first plurality of chip contact pads, respectively. The narrow central portions of the second plurality of leadframe segments are attached to the interconnection elements on the second plurality of chip contact pads, respectively. The device further uses an encapsulation material, preferably a molding compound, which covers the chip and the leadframe segments, but leaves the wide portions of the first and second segment pluralities, located in the second horizontal plane, exposed. The chip interconnection elements are bumps made either of reflowable metal or alloy, preferably tin or a tin alloy, or of non-reflowable metal or alloy, preferably gold.

In another embodiment of the invention, the assembly of the semiconductor chip and the three-level leadframe are as described for the previous embodiment, but the encapsulation compound leaves the chip surface opposite to the active chip surface exposed. It is a technical advantage that a heat spreader or heat sink can thus be attached directly to the chip, creating a device with improved thermal characteristics.

In many embodiments of the invention, the first plurality of chip contact pads and the first plurality of leadframe segments serve as device signal inputs/outputs; the second plurality of chip contact pads and the second plurality of leadframe segments serve as device power and ground inputs/outputs. It is a technical advantage that this arrangement provides a low voltage drop of the power I/Os and the core regions of the chip, making these devices suitable for high power and high speed applications.

It is further a technical advantage of the invention that the second plurality of leadframe segments has the narrow end portions terminate in the third horizontal plane, remote from the second horizontal plane, in which the wide end portions of the first leadframe plurality are located. This feature allows a tighter segment pitch than would be feasible with an arrangement, in which all segment ends terminate in the same plane. The embodiments of the invention can thus not only accommodate low I/O counts (for example, 8 to about 100), but also intermediate I/O counts (for example, up to 200).

The technical advances represented by certain embodiments of the invention will become apparent from the following description of the preferred embodiments of the invention, when considered in conjunction with the accompanying drawings and the novel features set forth in the appended claims.

DETAILED DESCRIPTION OF THE PREFERRED EMBODIMENTS

The present invention is related to U.S. Pat. No. 6,072,230, issued on Jun. 6, 2000 (Carter et al., "Exposed Leadframe for Semiconductor Packages and Bend Forming Method of Fabrication"), and U.S. patent application Ser. No. 09/900,080, filed on Jul. 6, 2001 (Abbott et al., "Pre-plating of Semiconductor Small Outline No-Lead Leadframes"), and Ser. No. 10/346,899, filed on Jan. 17, 2003 (Abbott, "Semiconductor Device with Double Nickel-Plated Leadframe").

Figure 1:
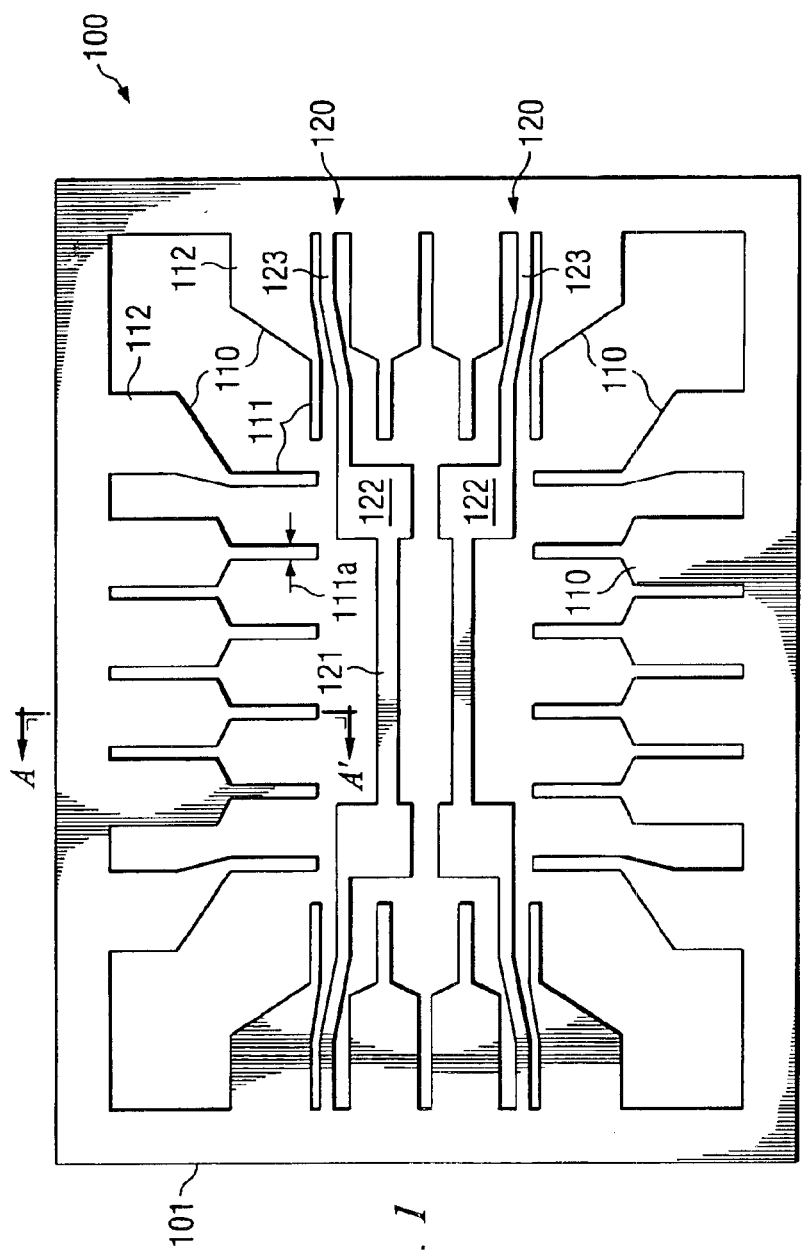
FIG. 1 is a schematic top view of an embodiment of the invention, illustrating a leadframe with two pluralities of segments for a flip-chip assembled device.
Figure 2:
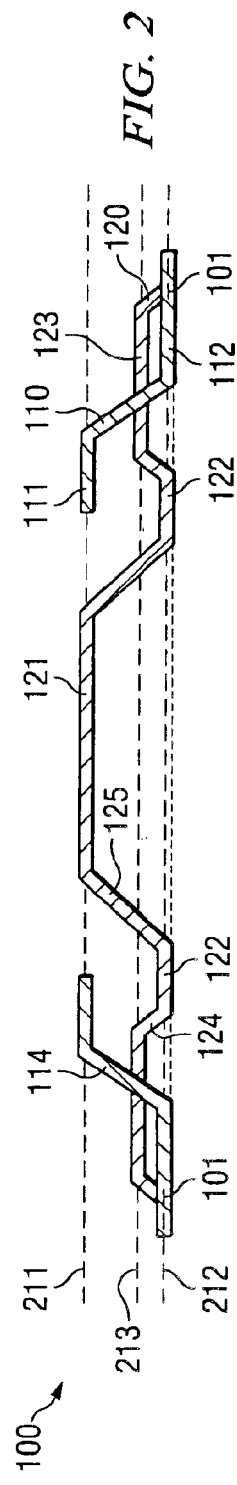
FIG. 2 is a schematic x-ray view of the leadframe in FIG. 1 after the forming step to create segment sections in three horizontal planes according to the invention.

FIG. 1 is a schematic and simplified top view of a leadframe, generally designated 100, for use in the assembly of semiconductor chips; FIG. 2 is a schematic x-ray view of leadframe 100 after the forming step. FIGS. 1 and 2 illustrate two pluralities of leadframe segments, held together by frame 101. Several segments of the first plurality are designated 110, and several segments of the second plurality are designated 120.

Each segment 110 of the first plurality has a narrow end portion 111 in a first horizontal plane 211 and a wide end portion 112 in a second horizontal plane 212. Each segment 120 of the second plurality has a narrow central portion 121 in the first horizontal plane 211, further at least one wide central portion 122 in the second horizontal plane 212, and narrow end portions 123 in a third horizontal plane 213. This third horizontal plane 213 is located between first plane 211 and second plane 212.

In the embodiments of the invention, the wide end portions 112 of the first segment plurality 110 have at least twice the width 111a of the narrow end portions 111. For practical fabrication reasons of the leadframes, the narrow end portion width 111a has usually at least the dimension of the leadframe material thickness (typically between 100 and 300 $\mu$m).

As FIG. 2 shows, there have to be segment portions which are bent in order to provide continuous connection between the segment portions in the various horizontal planes. As examples, FIG. 2 depicts portions 114 if the first segment plurality and portions 124 and 125 of the second segment plurality. The degree of bending depends, among other parameters, on the leadframe material; see below.

In the preferred embodiments, the leadframe 100 is made of a base metal fully covered with a plated layer. As defined herein, the starting material of the leadframe is called the "base metal", indicating the type of metal. Consequently, the term "base metal" is not to be construed in an electrochemical sense (as in opposition to 'noble metal') or in a structural sense.

For many semiconductor devices, the base metal is typically copper or copper alloys. Other choices comprise, but are not limited to, brass, aluminum, iron-nickel alloys ("Alloy 42"), and invar.

The base metal originates with a metal sheet in the preferred thickness range from 100 to 300 $\mu$m; thinner sheets are possible. The ductility in this thickness range provides the 5 to 15% elongation that facilitates the segment bending and forming operation. The leadframe is stamped or etched from the starting metal sheet.

Figure 3:
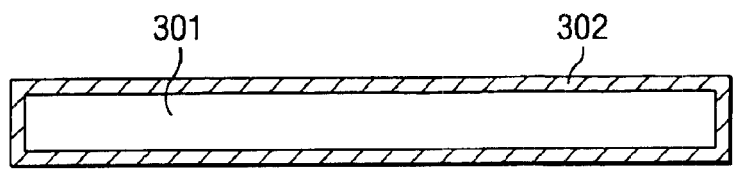
FIG. 3 is a schematic bottom view of another embodiment of the invention, illustrating the assembly of a semiconductor chip onto a leadframe having segment sections in three horizontal planes.

After the stamping or etching process, the leadframe is plated. In order to illustrate an example of the structure of the plated layers, a cross section of a segment of the first plurality is administered along line A–A' in FIG. 1 and shown in FIG. 3. The schematic cross section of the leadframe segment in FIG. 3 shows the base metal 301 and the first plated layer 302 on both surfaces of the base metal sheet 301. For many embodiments, layer 302 comprises nickel having a thickness between 0.2 and 1.0 $\mu$m, preferably 0.5±25 $\mu$m. Nickel is the preferred metal because, positioned under the tin-based solder of contemporary devices, it reduces the propensity for tin whiskers. Frequently, this nickel is rough and non-reflective; it is sometimes referred to as "TN nickel". The roughness of the nickel surface promotes adhesion between the nickel-plated leadframe and the molding compounds used for encapsulating semiconductor devices.

Figure 4:
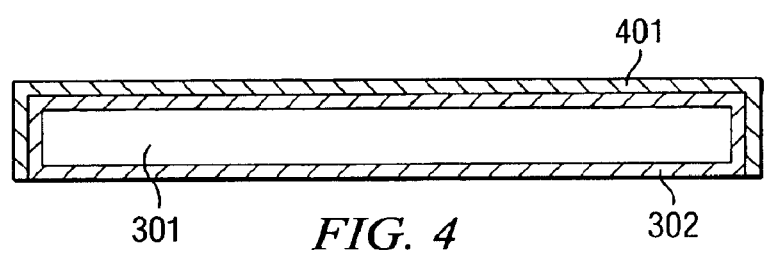
FIG. 4 is a schematic x-ray side view of an embodiment of the invention, showing a semiconductor power device intended for low ground/power voltage drop.

The plated layer is ductile for the leadframe segment bending and forming process. However, due to its rough surface, the rough nickel layer is visually very dull and non-reflective. Consequently, it may complicate the vision systems of automated semiconductor assembly steps requiring image recognition or alignments so that sometimes a plated nickel with smooth surface is preferred. However, this smooth nickel, commonly sulfamate nickel, does not adhere well to molding compounds. Therefore, sulfamate nickel may either be deposited only on surfaces where visual image recognition requires it for facilitating assembly steps (see cross section along line A–A' in FIG. 4, layer 401), or alternatively the sulfamate nickel may be covered with an additional adherent thin layer of palladium, gold, or alloys thereof, which promote adhesion to molding compounds. The sulfamate nickel layer is ductile for the leadframe bending and forming process. Further, both the rough and the smooth nickel layers are wettable in the soldering process, so that tin or solder alloys can be used successfully.

Figure 5:
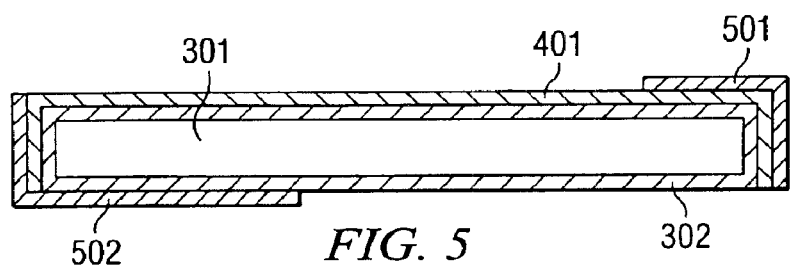
FIG. 5 is a schematic x-ray side view of an embodiment of the invention, showing a semiconductor device with enhanced thermal performance.

It is preferred that leadframe 100 comprises spots of additional plated layers, which promote the assembly steps of flip-chip attachment and external device attachment. For the flip-chip assembly step, two scenarios have to be considered, see FIG. 5. In the first scenario for embodiments with reflowable interconnection elements on the chip I/O pads, such as a tin alloy, adherent layer 501 is made of metals, which are solderable. In addition, metal surfaces intended for external solder attachment have adherent layer 502 made of metals, which are solderable. Examples for layers 501 and 502 include palladium, gold, platinum, silver, rhodium, or nickel as single metals or as alloys. These metals also have an affinity to molding compounds. The thickness of layers 501 and 502 is preferably in the range from 20 to 60 nm, but could, for cost reduction reasons, possibly be reduced to 10 to 30 nm.

Alternatively, layer 502 may be plated as a solder layer comprising, for example, tin or a tin alloy. While the semiconductor technology offers the option to deposit this solder layer after completion of the encapsulation step, it is preferred to deposit layer 502 before encapsulation in order to avoid the risk of delamination. This option is often referred to as pre-plating.

In the second scenario for embodiments with chip interconnection elements made of non-reflowable metals, such as gold, adherent layer 501 is made of non-oxidizing (noble) metals, which provide reliable electrical contact to the non-reflowable interconnection element. For this case, examples for layer 501 include gold, palladium, platinum, silver, or alloy thereof, preferably in the thickness range from 10 to 30 nm.

In the segment forming process step after completion of the layer depositions, the segments obtain a three-plane configuration as exemplified in FIG. 2. By way of explanation, an outside force, applied along the length of the segment, can stretch the segment in the direction of the length, while the dimension of the width is only slightly reduced, so that the new shape appears elongated. For elongations small compared to the length, and up to a limit, called the elastic limit given by the material characteristics, the amount of elongation is linearly proportional to the force (beyond that elastic limit, the segment would suffer irreversible changes and damage to its inner strength and could eventually break).

When a distance between planes on the order of about 400 to 500 $\mu$m has to be bridged, this challenge can usually be met while staying within the limits of material characteristics, if the distance is bridged by the segment at an inclination angle of 30° or less. For instance, with copper as basic element of the sheet material for the leadframes (thickness range 100 to 300 $\mu$m), appropriate alloys combined with suitable thermal treatment can be selected so that leadframes can be designed with straight segments capable of sustaining forced stretches to cover that distance at "shallow" angles (30° or less). If necessary, a multi-step configuration at angles of 40° or less can be adopted for covering that distance. As a side benefit, this configuration enhances mold rocking of plastic to the leadframe in transfer molded plastic packages.

In some devices, the direct distance of 400 to 500 $\mu$m between the planes may have to be bridged at angles steeper then 30°, for instance 45°; this need may happen in order to shrink the outline of a package (that is the area it consumes when mounted on a printed wiring board) as much as possible, or to accommodate an extra large chip pad in a given package. A copper segment elongation of more than 8% would be required, which is beyond the elastic limit of copper leadframe materials.

A twofold approach provides solutions for this need: Linearizing a designed-in bending, and stretching through forming. The contribution of linearizing can be obtained when a topologically long body is first designed so that it contains curves, bendings, meanderings or similar non-linearities. By applying force, at least part of the non-linearities is stretched or straightened so that afterwards the body is elongated. The contribution of stretching is similar to the elongation in the direction of the segment length discussed above. This stretching, therefore, will remain safely below the elastic limit of the leadframe material.

In the example of a leadframe with the segments in three planes, FIG. 1 configures the segments 110 of the first plurality so that each segment has a narrow end portion 111 and a wide end portion 112; for many device applications, it is practical to configure the wide end portion at least twice as wide as the narrow end portion. The segments 120 of the second plurality have narrow central portions 121 and end portions 123 combined with wide central portions 122. A leadframe with these features is depicted in FIG. 6 for use in the assembly of a chip 601 to create a semiconductor device generally designated 600.

Chip 601 has on its active surface 602 an integrated circuit with a first plurality of contact pads 603 generally located on the peripheral chip portions, and a second plurality of contact pads 604 generally located on the central chip portions. Each of these contact pads 603 and 604 has an interconnection element attached; the elements 703 and 704 are indicated in the schematic x-ray FIGS. 7 and 8. As stated above, the interconnection elements may be made of a reflowable alloy such as tin alloy, or a non-reflowable alloy such as gold alloy. In many devices, the contact pads of the first plurality serve as device signal inputs/outputs, and the contact pads of the second plurality serve as power and ground inputs/outputs.

Figure 6:
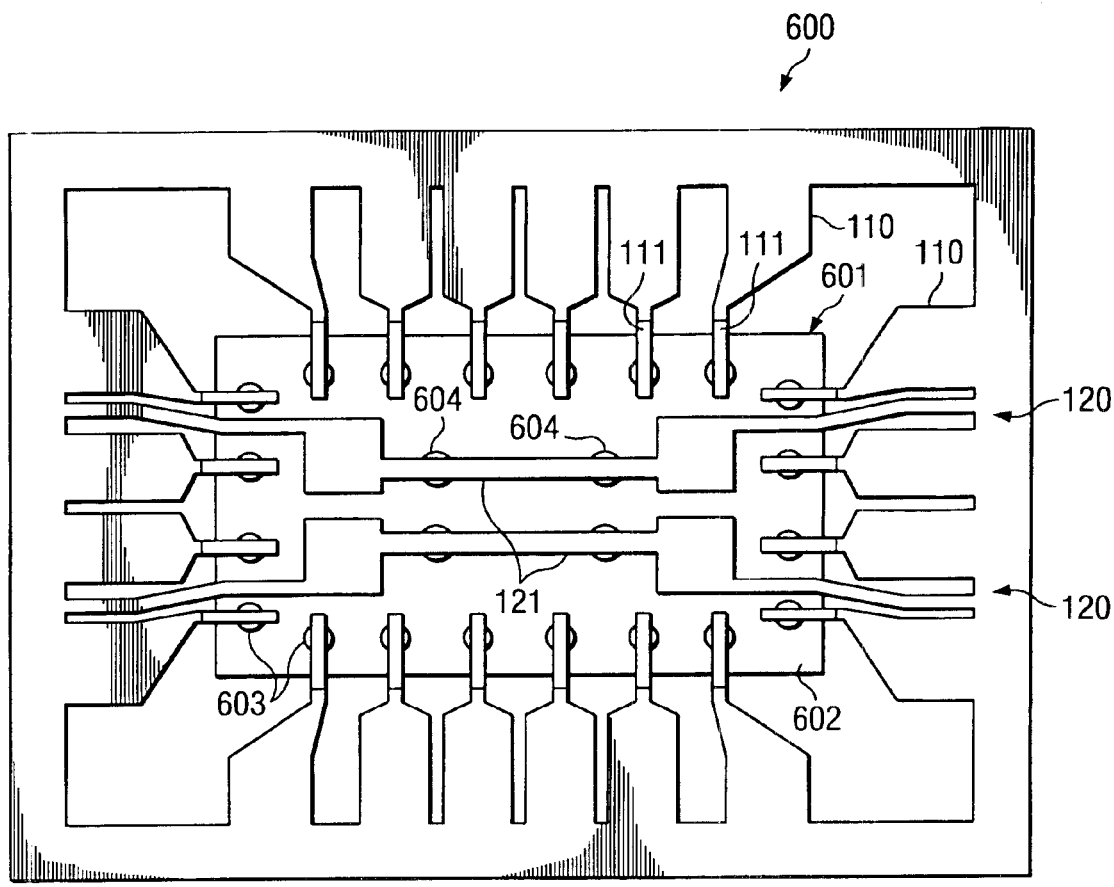
FIG. 6 is a schematic top view of a leadframe in accordance with the invention.

Referring to FIG. 6, the narrow end portions 111 of the first segment plurality 110 are attached to the interconnection elements on the peripheral chip contact pads 603. The narrow central portions 121 of the second segment plurality 120 are attached to the interconnection elements on the centrally located chip contact pads 604. The method of attachment depends on the material of the interconnection elements. For elements made of reflowable material, the attachment step involves a soldering process, for elements made of non-reflowable material, the attachment step involves a thermo-compression process.

Figure 8:
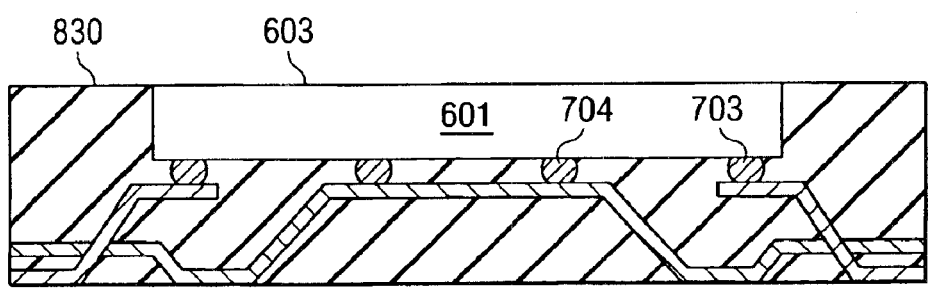
FIG. 8 is a schematic x-ray side view of another embodiment of the invention.
Figure 7:
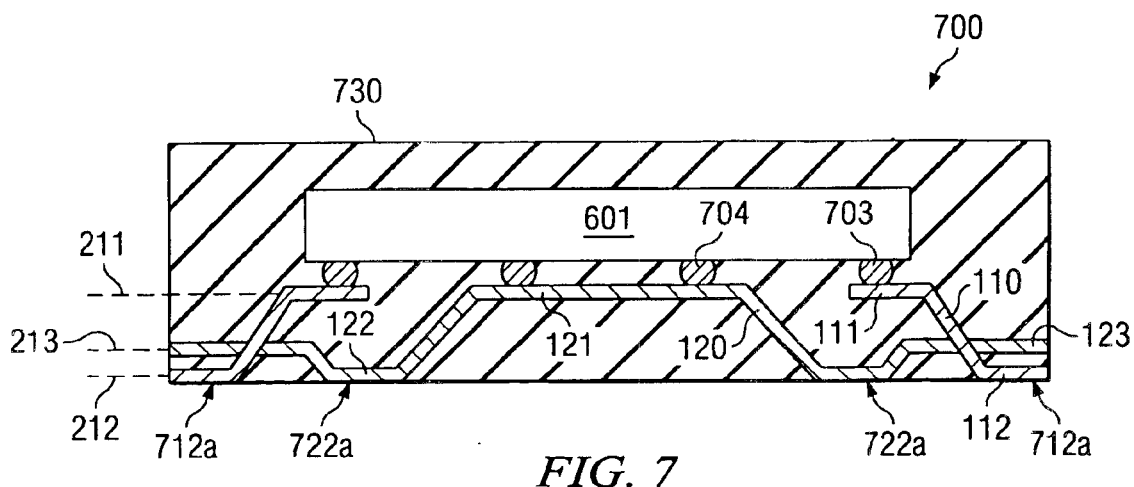
FIG. 7 is a schematic x-ray side view of another embodiment of the invention.

The schematic x-ray FIGS. 7 and 8 display the position of chip 601 relative to the three segment planes 211, 212, and 213 of leadframe 100 after completing the assembly steps. FIGS. 7 and 8 further illustrate the completion of the device by protecting chip and leadframe segments with encapsulation material, and then performing the trimming step of the frame. In FIG. 7, a device, generally designated 700, is formed by encapsulating chip 601 from all sides together with most of the leadframe segments, leaving exposed only those external-facing surfaces of the wide segment portions of the first and second segment pluralities, which are located in the second horizontal plane 212. In FIG. 7, the encapsulation material is designated 730, and the exposed segment surfaces are marked 712a and 722a. A preferred choice for the encapsulation material 730 is an epoxy-based molding compound with silicate and alumina fillers, which permits the usage of the well-controlled transfer molding method.

FIG. 8 shows an embodiment, in which the encapsulation material 830 also leaves the passive surface 603 of chip 601 exposed. The embodiment of FIG. 8 is favored by devices with a need for enhanced thermal characteristics. A heatsink or other good thermal conductor can be attached to chip surface 603, enabling improved heat removal and chip cooling.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the material of the semiconductor chip may comprise silicon, silicon germanium, gallium arsenide, or any other semiconductor or compound material used in IC manufacturing.

As another example, the process step of stamping the leadframes from a sheet of base metal may be followed by a process step of selective etching, especially of the exposed base metal surfaces in order to create large-area contoured surfaces for improved adhesion to molding compounds.

It is therefore intended that the appended claims encompass any such modifications or embodiments.

I claim:

1. A leadframe for use in the assembly of semiconductor chips, comprising:

a first plurality of leadframe segments, each segment of said first plurality having a narrow end portion in a first horizontal plane and a wide end portion in a second horizontal plane; and a second plurality of leadframe segments, each segment of said second plurality having a narrow central portion in said first horizontal plane, at least one wide central portion in said second horizontal plane, and narrow end portions in a third horizontal plane, said third plane located between said first and second planes.

2. The leadframe according to claim 1 wherein said wide end portion has at least twice the width of said narrow end portion.

3. The leadframe according to claim 1 further comprising bent segment portions to connect said segment portions in said planes.

4. The leadframe according to claim 1 further comprising surfaces of said wide segment portions of said first and second pluralities, which are covered by a layer of noble metal.

5. The leadframe according to claim 4 wherein said noble metal is gold.

6. The leadframe according to claim 1 further comprising surfaces of said wide segment portions of said first and second pluralities, which are covered by a layer of solderable metal.

7. The leadframe according to claim 6 wherein said solderable metal is a layer of nickel with an outermost layer of palladium.

8. The leadframe according to claim 1 further comprising surfaces of said narrow end portions of said first segment plurality and the narrow central portions of said second segment plurality, which are covered by a layer of solderable metal.

9. The leadframe according to claim 1 further comprising surfaces of said narrow end portions of said first segment plurality and the narrow central portions of said second segment plurality, which are covered by a layer of noble metal.

10. A semiconductor device comprising:

a leadframe having a first plurality of segments, each segment of said first plurality having a narrow end portion in a first horizontal plane and a wide end portion in a second horizontal plane;

said leadframe further having a second plurality of segments, each segment of said second plurality having a narrow central portion in said first horizontal plane, at least one wide central portion in said second horizontal plane, and narrow end portions in a third horizontal plane, said third plane located between said first and second planes;

an integrated circuit chip having on its active surface a first plurality of contact pads located in the peripheral chip portions, and a second plurality of contact pads centrally located, each of said pads having an interconnection element attached;

said narrow end portions of said first plurality of leadframe segments attached to said interconnection elements on said first plurality of chip contact pads, respectively; and said narrow central portions of said second plurality of leadframe segments attached to said interconnection elements on said second plurality of chip contact pads, respectively.

11. The device according to claim 10 further comprising an encapsulation material covering said chip and said leadframe segments, leaving exposed said wide portions of said first and second segment pluralities located in said second horizontal plane.

12. The device according to claim 10 wherein said first plurality of chip contact pads and said first plurality of leadframe segments serve as device signal inputs/outputs.

13. The device according to claim 10 wherein said second plurality of chip contact pads and said second plurality of leadframe segments serve as device power and ground inputs/outputs.

14. The device according to claim 10 wherein said interconnection element is a bump made of reflowable metal or alloy.

15. The device according to claim 10 wherein said interconnection element is a bump made of non-reflowable metal or alloy.

16. The device according to claim 10 wherein said wide segment portions have surfaces covered by a layer of noble metal.

17. The device according to claim 10 wherein said wide segment portions have surfaces covered by a layer of solderable metal.

18. The device according to claim 11 wherein said encapsulation material is a molding compound.

19. The device according to claim 11 wherein said encapsulation material further leaves exposed the chip surface opposite to said active surface.

* * * * *